United States Patent [19]

Yoshizawa

[11] Patent Number: 4,594,675

[45] Date of Patent: Jun. 10, 1986

[54] SAMPLING MEASUREMENT DATA GENERATION APPARATUS

[75] Inventor: Yasuo Yoshizawa, Yonezawa, Japan

[73] Assignee: Yoshiki Industrial Co., Ltd., Yonezawa, Japan

[21] Appl. No.: 526,865

[22] Filed: Aug. 26, 1983

[51] Int. Cl.[4] .................................................. G06F 15/20
[52] U.S. Cl. .................................... 364/558; 73/117.3; 250/231 SE
[58] Field of Search ............... 364/558; 73/116, 117.1, 73/117.2, 117.3; 340/347 P; 250/231 SE

[56] References Cited

U.S. PATENT DOCUMENTS

| | | | |
|---|---|---|---|
| 4,081,995 | 4/1978 | Griffith et al. | 73/117.3 X |
| 4,271,469 | 6/1981 | Kawai et al. | 364/511 X |
| 4,308,500 | 12/1981 | Avins | 340/347 P X |
| 4,342,025 | 7/1982 | Spälti et al. | 250/231 SE X |

Primary Examiner—Gary Chin
Assistant Examiner—Heather R. Herndon
Attorney, Agent, or Firm—Oblon, Fisher, Spivak, McClelland & Maier

[57] ABSTRACT

Sampling pulses are obtained by a plurality of sampling through holes which are formed at equal angular intervals in a disc encoder which is fixed to a crankshaft of a piston engine to be measured. An analog output from a pressure sensor for sensing the pressure inside a cylinder is sampled, held by the obtained sampling pulses and converted into a digital signal to provide digital measurement data. The digital measurement data is written into a RAM during a positive period of an internal clock pulse under the control of a direct memory access control circuit and the RAM is accessed by a CPU during a negative period of the internal clock pulse. The digital data read out of the RAM is undergone for the data arithmetic operation by the CPU in the realtime manner.

4 Claims, 4 Drawing Figures

F I G. 1
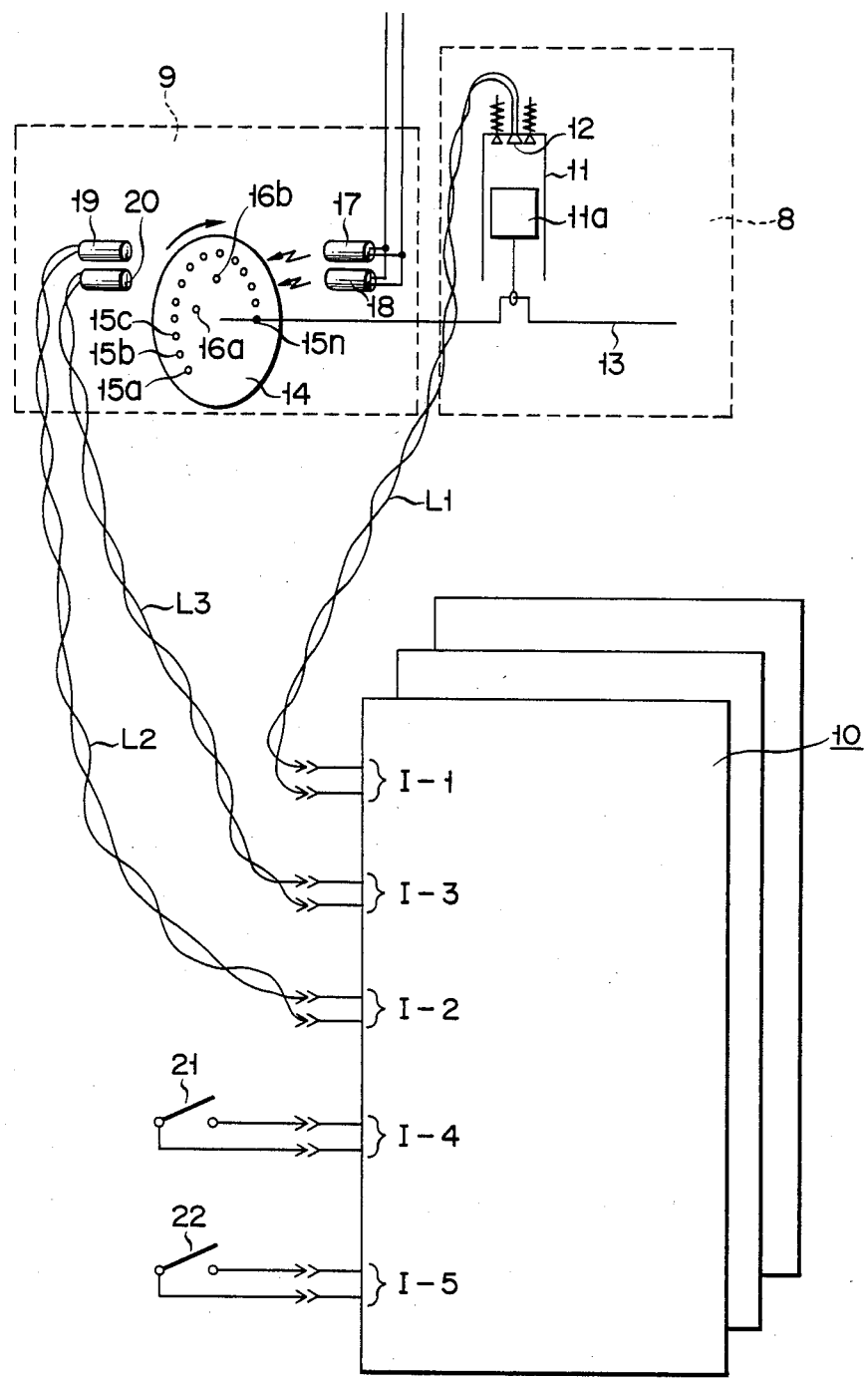

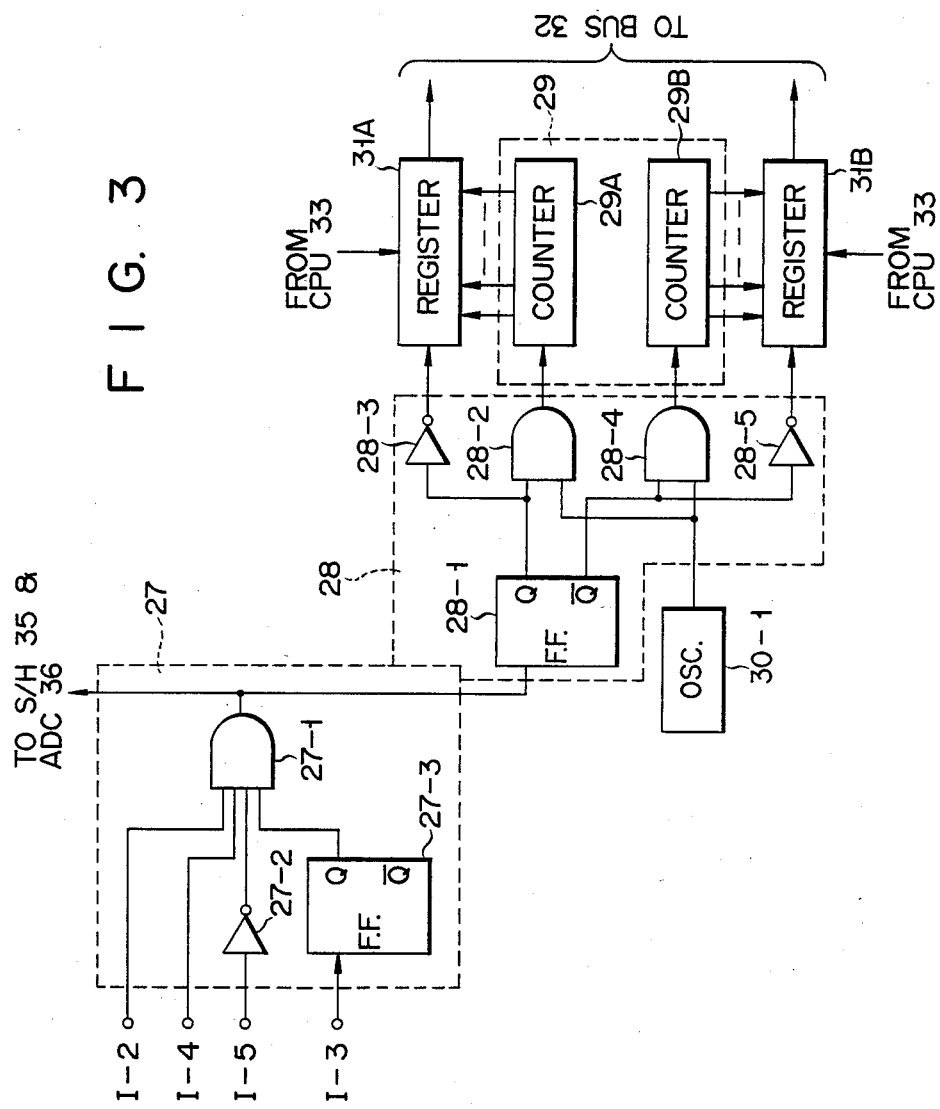
F I G. 3

SAMPLING MEASUREMENT DATA GENERATION APPARATUS

BACKGROUND OF THE INVENTION

1. Field of the Invention

The present invention relates to a measurement data generation apparatus for measuring, by sampling, object movement which nonlinearly changes over time.

2. Discussion of the Background

When sampling/measurement of an engine rpm, cylinder temperature, pressure and the like which indicate operating conditions of a vehicle is performed, a clock signal generated by a reference signal oscillator independently arranged in the measuring apparatus is used as a sampling signal. Analog data obtained by sampling is converted into digital data and is supplied to a microcomputer mounted on the vehicle. The engine operation is controlled in accordance with such digital data.

In this case, the period of the clock signals generated by the reference clock generator remains constant. However, when the engine rotates irregularly, the number of samples obtained upon one revolution of the engine differs from that obtained upon another revolution of the engine. This prevents correct measurement of the operating conditions of the engine and reliable control of the engine.

When cylinder pressure of a reciprocal engine at a position which is before the top dead center by 30° is being measured, the conventional measurement apparatus can not produce a sampling pulse correctly at the position where the engine is before the top dead center by 30°. To this end, a plurality of data is obtained for the position near the desired position before the top dead center by 30°. The obtained data is then statistically processed to have an approximated measurement value at the desired position. This conventional measurement method, however, requires much time. Moreover, since the engine operation state varies with time, it is not possible to obtain a correct data. Particularly, even if an irregular or remarkable phenomenon occurs once for several revolutions of the engine, a data representing such a phenomenon can not be obtained, because the measurement data is processed statistically to have an average data. When the temperature variation in an engine is being measured for 24 hours from the start of the engine, it is necessary to set the sampling frequency high for the initial operation period at which the temperature variation rate is relatively high. If this is the case, however, number of sampled data obtained after the engine temperature reaches to a normal running state also becomes very large, thereby requiring much labor and consuming time.

Further, it is difficult to correctly reproduce a characteristic curve representing a relationship between a rotational position of an engine and the pressure in a cylinder, because a correct relationship between the rotational position and the pressure can not be obtained by the conventional measurement method. For the precise approximation of the reproduced characteristic curve with the original curve, it is necessary to statistically process many samples. This method, however, requires much time and fails the correct reproduction of the original curve.

SUMMARY OF THE INVENTION

It is, therefore, an object of the present invention to provide a sampling measurement data generation apparatus which is capable of consistently obtaining a predetermined number of samples within a time period unit independent of the movement of an object to be measured, and which is capable of performing a realtime correct measurement and capable of reproduction of characteristic curves.

In order to achieve the above and other objects of the present invention, there is provided a sampling measurement data generation apparatus comprising means for generating sampling signals having a period corresponding to movement of the object to be measured, means for sampling an input analog measurement signal using the sampling signals, means for converting the sampled input analog measurement signal into a digital signal, and control means for extracting a predetermined portion of the digital signal as measurement data and storing the measurement data in a digital memory.

BRIEF DESCRIPTION OF THE DRAWINGS

FIG. 1 is a schematic diagram of a sampling measurement data generation apparatus according to the present invention;

FIG. 3 is a block diagram showing in detail a part of the circuit shown in FIG. 2.

DETAILED DESCRIPTION OF THE PREFERRED EMBODIMENT

Figure 2:
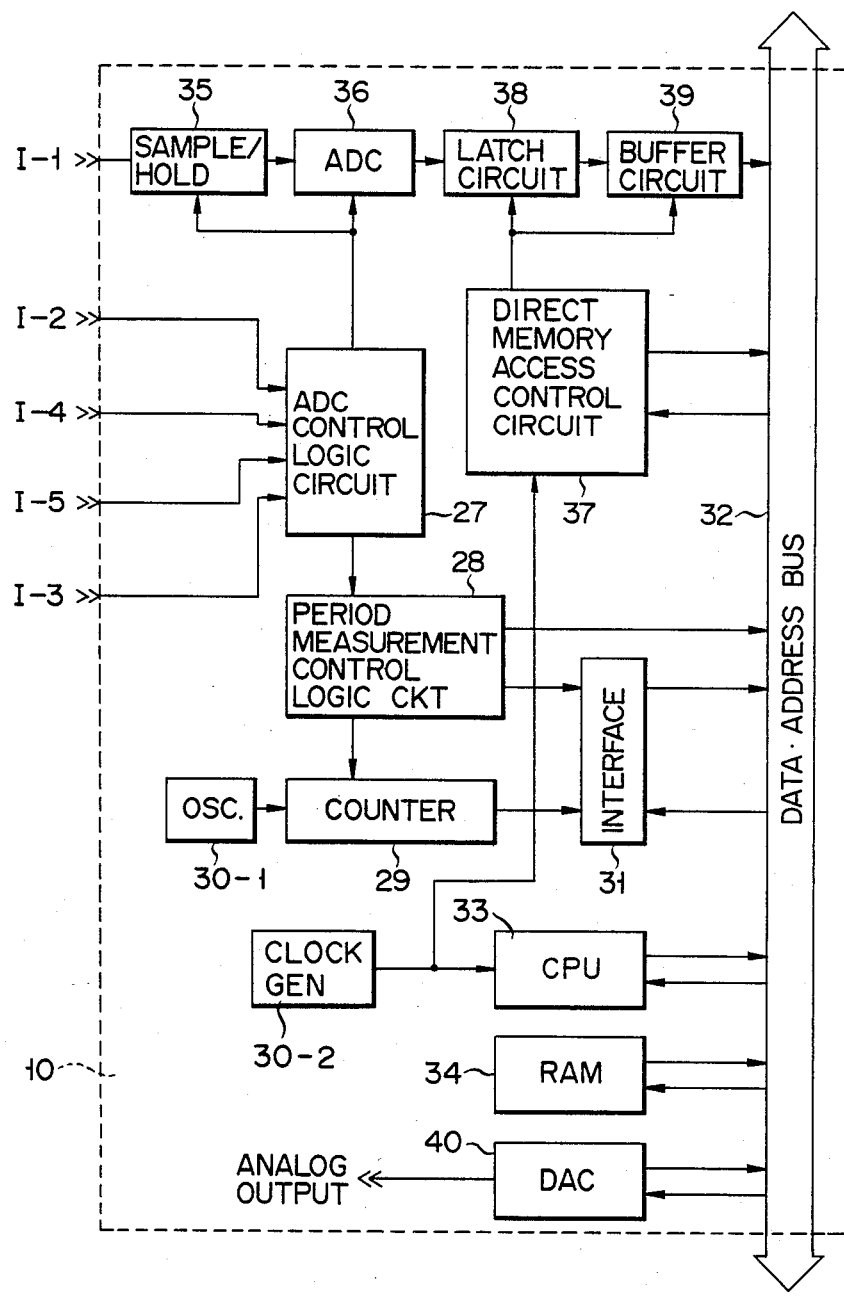
FIG. 2 is a block diagram of the apparatus shown in FIG. 1.

The preferred embodiment of the present invention will now be described with reference to the accompanying drawings. In this embodiment, the present invention is applied to an apparatus for measuring the cylinder pressure in a compression stroke of a reciprocal piston engine as a function of the rotational angle of the crankshaft.

Referring to FIG. 1, a signal processing unit 10 receives an analog measurement signal from a sensor unit 8 through a signal line L1 and also receives control signals from a control signal generator unit 9 through signal lines L2 and L3. One end of the signal line L1 is connected to a pressure sensor 12 mounted at the top end of a cylinder 11, and the other end is connected to an analog measurement signal input terminal I-1 of the signal processing unit 10. A piston 11a reciprocating within the cylinder 11 is coupled to a crankshaft 13. A disc encoder 14 is mounted at one end of the crankshaft 13. A plurality of through holes 15a, 15b, ..., 15n are formed at equal angular intervals on the first concentric circle of the disc encoder 14. Two through holes 16a and 16b are formed which have a predetermined interval therebetween on a second concentric circle of the disc encoder 14. The holes 15a, 15b, ..., 15n are for generating sampling signals, and the holes 16a and 16b are for generating measurement range setting signals. Two light sources 17 and 18 are arranged at one side of the disc encoder 14 to correspond with the holes 15a, 15b, ..., 15n and the holes 16a and 16b, respectively. Light-receiving elements 19 and 20 for receiving light are arranged at the other side of the disc encoder 14 in correspondence with the holes 15a, 15b, ..., 15n and the holes 16ai a and 16b, respectively. The light-receiving elements 19 and 20 are connected to one end of the corresponding signal lines L2 and L3. The other end of each of the signal lines L2 and L3 is connected to a sampling signal input terminal I-2 of the signal processing unit 10 and to a measurement range setting signal input terminal I-3, respectively. The signal processing unit 10 further has a start signal input terminal I-4 and a stop signal input terminal I-5. A manual start signal generated upon turning on of a switch 21 is supplied to the input terminal I-4. A manual stop signal generated upon turning on of a switch 22 is supplied to the input terminal I-5.

The signal processing unit 10 has a configuration as shown in FIG. 2. Pulse signals from the light-receiving elements 19 and 20 shown in FIG. 1 are supplied to two input terminals of an ADC (analog-to-digital converter) control logic 27 through the input terminals I-2 and I-3, respectively. The ON signals of the switches 21 and 22 are supplied to the remaining two input terminals of the ADC control logic 27 through the input terminals I-4 and I-5, respectively. The ADC control logic 27 serves to generate sampling signals, details of which will be described later. Sampling signals from the ADC control logic 27 are supplied to a period measurement control logic 28 for measuring periods of the sampling signals. The period measurement control logic 28 supplies a count command signal to a counter 29 only for the time period corresponding to the sampling period. In response to the count command signal, the counter 29 counts 1-MHz reference pulses, for example, from a reference signal oscillator 30-1.

The counter 29 counts the reference pulses only for one sampling period. The count of the counter 29 is then transferred to an interface 31 under the control of the period measurement control logic 28. Then, the counter 29 is cleared. For the next sampling period, another reference pulse is supplied to the counter 29 which then resumes the counting operation. The count data temporarily stored in the interface 31 has a value corresponding to the pulse interval of the sampling pulses and is stored in a RAM 34 under the control of a CPU 33 coupled to a data address bus 32. Ihe CPU 33 uses the bus 32 for a period of clock $\phi$ of 1 $\mu$ sec. generated from a clock generator 30-2.

Meanwhile, the sampling pulse from the ADC control logic 27 is supplied to a control terminal of a sample/hold circuit 35. In response to the sampling pulse, the sample/hold circuit 35 samples and holds a pressure signal supplied to its input terminal I-1 from the pressure sensor 12. An output from the sample/hold circuit 35 is supplied to an ADC 36. In response to a sampling pulse supplied to its control terminal, the ADC 36 converts the output from the sample/hold circuit 35 into a digital signal. The digital signal from the ADC 36 is controlled by an output from a direct memory access control circuit (DMAC) 37, latched in a latch circuit 38, and is fed onto the bus 32 through a buffer circuit 39. The DMAC 37 can use the bus 32 during a clock $\bar{\phi}$ of 1 $\mu$ sec. generated from the clock generator 30-2. The pressure data supplied on the bus 32 under the control of the DMAC 37 is supplied to the RAM 34 to be stored therein.

Referring to FIG. 3, the configuration of the ADC control logic 27, the period measurement control logic 28, the counter 29, and the interface 31 shown in FIG. 2 will now be described. Referring to FIG. 3, the input terminals I-2 and I-4 are respectively connected to first and second input terminals of a 4-input AND circuit 27-1. The input terminal I-5 is connected to the third input terminal of the AND circuit 27-1 through an inverter 27-2. The input terminal I-3 is connected to the input terminal of a flip-flop 27-3, the Q output terminal of which is connected to the fourth input terminal of the AND circuit 27-1. An output from the AND circuit 27-1 is supplied to the sample/hold circuit 35 and the ADC 36 as a sampling signal output from the ADC control logic 27, and is also supplied to the input terminal of a flip-flop 28-1 of the period measurement control logic 28.

The Q output terminal of the flop-flop 28-1 is connected to one input terminal of an AND circuit 28-2 and to the input terminal of an inverter 28-3. The $\overline{Q}$ output terminal of the flip-flop 28-1 is connected to one input terminal of an AND circuit 28-4 and to the input terminal of an inverter 28-5. A reference pulse output from the reference signal oscillator 30-1 is supplied to the other input terminal of each of the AND circuits 28-2 and 28-4. The output terminals of the AND circuits 28-2 and 28-4 are respectively connected to the input terminals of counters 29A and 29B. The output terminals of the inverters 28-3 and 28-5 are respectively connected to control input terminals of registers 31A and 31B. The respective bit output terminals of the counters 29A and 29B are connected to corresponding bit input terminals of the registers 31A and 31B. When control signals are supplied from the inverters 28-3 and 28-5, the contents of the counters 29A and 29B are transferred to the registers 31A and 31B, respectively. The registers 31A and 31B constitute the interface 31 shown in FIG. 2. The output terminal of the interface 31 is connected to the bus 32. Although a single counter 29 is shown in FIG. 2, two counters 29A and 29B are preferably used as shown in FIG. 3.

Figure 4:
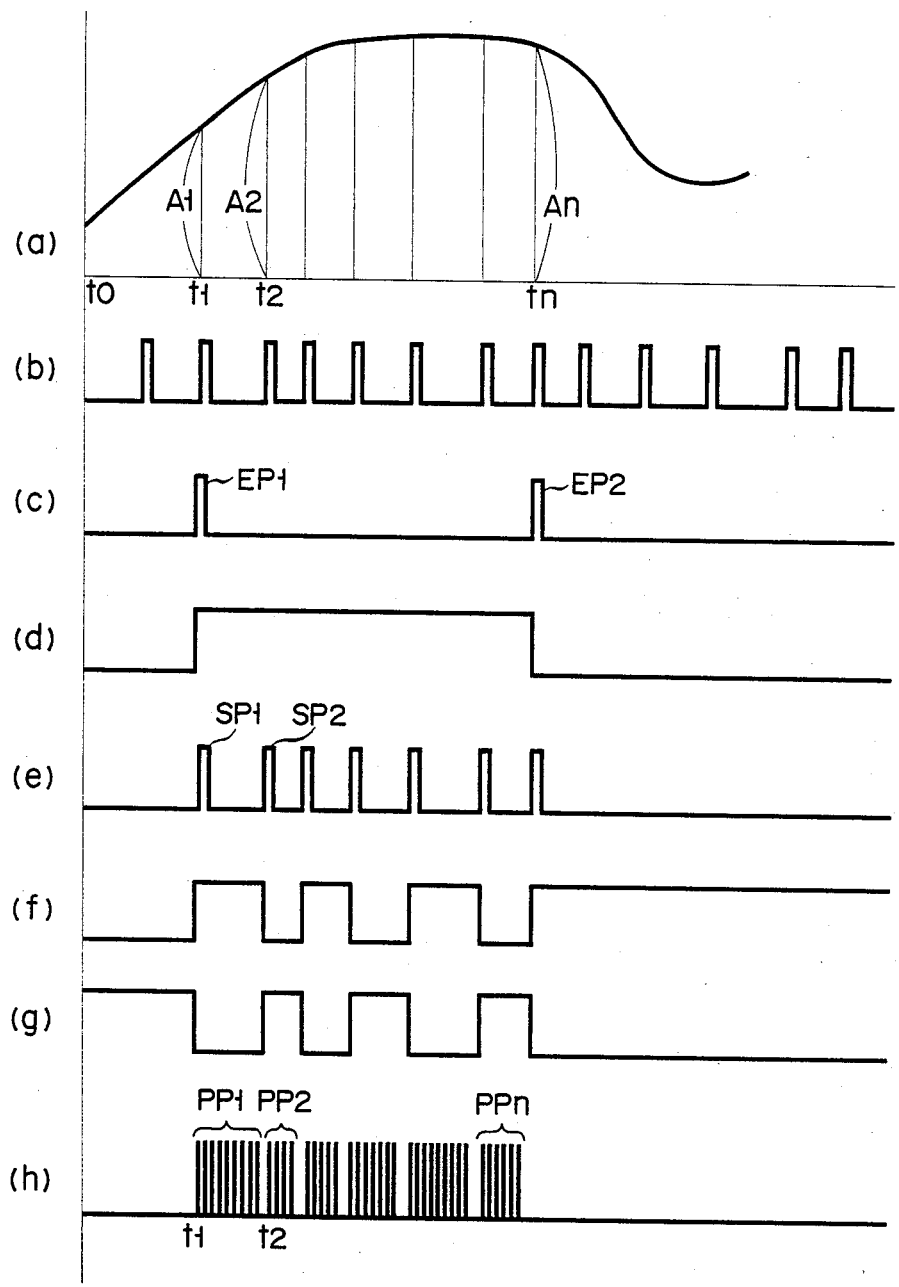
FIGS. 4a–4g shows timing charts for explaining the mode of operation of the apparatus shown in FIGS. 1 to 3.

The mode of operation of the apparatus shown in FIGS. 1 to 3 will now be described with reference to FIG. 4. When the piston engine to be measured is operating, light emitted from the light sources 17 and 18 intermittently strikes the light-receiving elements 19 and 20, respectively, through the through holes 15a to 15n and the through holes 16a and 16b of the rotating disc encoder 14. In the time period t0 to tn in which the piston 11a moves upward within the cylinder 11 and the pressure in the cylinder 11 is increased, the output from the pressure sensor 12 changes as shown in FIG. 4(a). An analog output signal from the pressure sensor 12 is supplied to the sample/hold circuit 35 through the input terminal I-1.

In response to incident light pulses received through the through holes 15a to 15n, the light-receiving element 19 generates a pulse train signal as shown in FIG. 4(b). The pulse train signal is supplied to the first input terminal of the AND circuit 27-1 in the ADC control logic 27. In response to light pulses received through the through holes 16a and 16b, which are formed in the disc encoder 14 in correspondence with a preset rotational angle of the crankshaft 13 of 30° immediately prior to and including the top dead center of the piston 11a, the light-receiving element 20 produces enable pulses EP1 and EP2 at times t1 and tn, respectively, as shown in FIG. 4(c). These two enable pulses EP1 and EP2 define the measurement range. The enable pulses EP1 and EP2 are supplied to the flip-flop 27-3 through the input terminal I-3. The flip-flop 27-3 is set by the first enable pulse EP1 and a pulse as shown in FIG. 4(d) is supplied from its Q output terminal to the AND circuit 27-1. If the manual start switch 21 is ON and the manual stop switch 22 is OFF, a manual start signal of logic level "1" is supplied to the AND circuit 27-1 through the input terminal I-4. Since a signal of logic level "0" is supplied to the input terminal I-5, an output from the inverter 27-2 is at logic level "1". The gate of the AND circuit 27-1 is opened, so that the pulse train signal shown in FIG. 4(b) is supplied to the input terminal I-3 and appears at the output terminal of the AND circuit 27-1 at time t1 and thereafter, as shown in FIG. 4(e).

When the enable pulse EP2 is generated, the flip-flop 27-3 is reset, and the output from the flip-flop 27-3 falls at time tn, as shown in FIG. 4(d). As a result, the gate of the AND circuit 27-1 is opened, and the sampling pulses obtained at the output terminal of the AND circuit 27-1 are those obtained from time t1 to time tn, as shown in FIG. 4(e).

The sampling pulses obtained in this manner are supplied to the sample/hold circuit 35 and an output from the pressure sensor 12 is sampled and held. Sampling is performed by sampling pulses at times t1, t2, . . . , tn as shown in FIG. 4(a). Output amplitudes A1, A2, . . . , An at times t1, t2, . . . , tn from the pressure sensor 12 are held. The held analog amplitudes A1, A2, . . . , An are supplied to the ADC 36 to be converted into digital values. The obtained digital values are sent forth on the bus 32 during the clock period $\bar{\phi}$ under the control of the DMAC 37 to be stored in the RAM 34. The digital data stored in the RAM 34 is then accessed by the CPU 33 during the next period of $\phi$ through the bus 32. Thus, during the clock $\phi$ the digital data is stored and during the next clock $\bar{\phi}$ the operation using the stored data is executed by the CPU 33 in a realtime fashion.

The sampling pulses shown in FIG. 4(e) are supplied to the input terminal of the flip-flop 28-1 in the period measurement control logic 28. Therefore, every time the flip-flop 28-1 receives a sampling pulse, it is repeatedly set and reset, and its Q and $\bar{Q}$ output terminals produce outputs having a phase difference of 180° as shown in FIGS. 4(f) and 4(g). When the flip-flop 28-1 is set by a sampling pulse SP1 at time t1, its Q output goes to logic level "1" while its $\bar{Q}$ output goes to logic level "0". Thus, the gate of the AND circuit 28-2 is opened; the output pulse from the reference signal oscillator 30-1 is passed through the AND circuit 28-2 and is supplied to the counter 29A to be counted thereby. Since the output from the inverter 28-3 is at logic level "0" at this time, the count of the counter 29A is not transferred to the register 31A.

Since the $\bar{Q}$ output from the flip-flop 28-1 is at logic level "0", the gate of the AND circuit 28-4 is closed and there is no new input. However, since the output from the inverter 28-5 is at logic level "1", the count of the counter 29B is transferred to the register 31B and the counter 29B is cleared.

When a sampling pulse SP2 is supplied to the flip-flop 28-1 at time t2, its Q output goes to logic level "0" and its $\bar{Q}$ output goes to logic level "1". Then, the gate of the AND circuit 28-2 is closed, and the gate of the AND circuit 28-4 is opened. Then, the output pulses from the oscillator 30-1 are counted by the counter 29B. Meanwhile, the output from the inverter 28-3 as a transfer command is at logic level "1". Thus, the count of the counter 29A is transferred to the register 31A and the counter 29A is cleared. The count of the counter 29A which is transferred to the register 31A this time corresponds to a sampling period PP1 between sampling pulses SP1 and SP2. This count can be expressed as the number of output pulses from the oscillator 30-1 which are counted by the counter 29A, as in FIG. 4(h).

In a similar manner, the counters 29A and 29B count the output pulses from the oscillator 30-1 in accordance with the sampling periods PP1, PP2, and so on, and transfer their counts to the registers 31A and 31B, respectively. Sampled digital data A1, A2, . . . , An of the output from the pressure sensor 12 obtained in this manner and sampling periods PP1, PP2, . . . , PPn alternately obtained from the registers 31A and 31B thus have correct correlation. In addition, the number of samples obtained within a preset measurement range remains constant irrespective of irregular rotation of the piston engine.

Measurement data stored in the RAM 34 is read out together with sample period data when an access thereto is made from the CPU 33. The readout data is supplied as an analog signal from a digital-to-analog converter (DAC) 40 for engine control, and correct reproduction of the characteristic curve can be realized.

The above description has been made with reference to an embodiment wherein data representing the relationship between the engine rpm and the cylinder pressure is obtained. However, it is also possible to measure data which represents the relationship between the rotation of a rod-like member and a travel distance of a blade of a threader when threads are formed in the rod.

In the above embodiment sampling pulses generated from a pulse train signal formed by using the encoder disc 14 are used. Further, it is possible to provide a pulse generator (not shown) generating a pulse signal whose pulse repetition rate logarithmically varies. The last mentioned pulse signal may be supplied to the circuits 35 and 36 as a sampling signal. The use of such a pulse signal is very effective for an object measurement wherein a plurality of samples are required in the starting measurement period and then samples whose interval may be longer than that generated in the starting measurement period.

What is claimed is:

1. A sampling measurement data generation apparatus comprising:
   means for generating a continuous analog signal which represents a physical state of a moving object to be measured;
   an encoder mechanically coupled to said moving object so as to move in synchronism with the moving object;
   means for generating sampling signals having a period corresponding to movement of said encoder;
   means for generating a measurement start signal and a measurement end signal for presetting a measurement range corresponding to movement of said encoder;
   means for sampling said continuous analog signal using said generated sampling signals;
   means for generating clock signals;
   means for counting the number of said clock signals which appear between each of adjacent two of said sampling signals generated by said sampling signals generation means;
   means for converting said sampled analog signal into digitial signals; and
   means for storing said digital signals;
   whereby the sampling period is determined by the output of said means for counting with said number of said clock signals being related to said digital data stored in said storing means.

2. An apparatus according to claim 1, wherein said storing means comprises: a digital memory and said apparatus further comprising means for generating a rectangular pulse signal having positive and negative periods appearing alternately; a direct memory access control circuit for writing the digital signal into the digital memory during one of the positive and negative periods of the rectangular pulse signal; and a CPU for executing an arithmetic operation of the digital signal stored in the digital memory during the other of the positive and negative periods of the rectangular pulse signal.

3. An apparatus according to claim 1, wherein said encoder has a disc member coupled to said object to be measured, a plurality of sampling through holes formed on a concentric circle around a center of rotation of said disc member, and a first light source and a first light-receiving element which are arranged at respective sides of said disc encoder so as to oppose said sampling through holes; and said measurement range presetting means, including first and second enable through holes arranged in said disc member at two ends of the preset measurement range, and a second light source and a second light-receiving element which are arranged at respective sides of said disc member so as to oppose said enable through holes.

4. An apparatus according to claim 1, wherein said means for storing comprises: a flip-flop which is alternately set and reset upon reception of the sampling signal; first and second AND gates which are alternately controlled by set and reset outputs from said flip-flop; means for supplying a period measurement pulse to said first and second AND circuits; first and second counters for counting output pulses from said first and second AND circuits; and first and second registers to which counts of said first and second counters are transferred in accordance with the set and reset outputs from said flip-flop.

* * * * *